(12) United States Patent
Suzuki et al.

(10) Patent No.: US 11,264,061 B2
(45) Date of Patent: Mar. 1, 2022

(54) CONTROL METHOD FOR MEMORY DEVICE

(71) Applicant: KIOXIA CORPORATION, Tokyo (JP)

(72) Inventors: Ryota Suzuki, Yokkaichi Mie (JP); Tatsuo Izumi, Yokkaichi Mie (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/197,632

(22) Filed: Mar. 10, 2021

(65) Prior Publication Data

US 2021/0193194 A1 Jun. 24, 2021

Related U.S. Application Data

(63) Continuation of application No. 16/526,589, filed on Jul. 30, 2019, now abandoned, which is a (Continued)

(30) Foreign Application Priority Data

Sep. 8, 2017 (JP) .............................. JP2017-173233

(51) Int. Cl.
| | |
|---|---|
| *G11C 16/10* | (2006.01) |
| *G11C 5/14* | (2006.01) |
| *G11C 11/56* | (2006.01) |
| *G11C 29/50* | (2006.01) |
| *G11C 16/08* | (2006.01) |
| *G11C 16/12* | (2006.01) |

(Continued)

(52) U.S. Cl.
CPC .......... *G11C 5/147* (2013.01); *G11C 11/5628* (2013.01); *G11C 11/5642* (2013.01); *G11C 16/08* (2013.01); *G11C 16/10* (2013.01); *G11C 16/12* (2013.01); *G11C 16/30* (2013.01); *G11C 16/3418* (2013.01); *G11C 29/50* (2013.01); *H01L 27/115* (2013.01); *G11C 8/08* (2013.01); *G11C 16/0483* (2013.01); *G11C 16/32* (2013.01); *G11C 2029/5004* (2013.01); *H01L 27/11582* (2013.01)

(58) Field of Classification Search
CPC ......... G11C 5/147; G11C 16/10; G11C 16/12; G11C 11/5628; G11C 11/5642; G11C 16/08; G11C 16/30; G11C 16/3418; G11C 29/50; G11C 16/0483; G11C 16/32; G11C 2029/5004; G11C 8/08; G11C 16/22; H01L 27/115; H01L 27/11582

See application file for complete search history.

(56) References Cited

U.S. PATENT DOCUMENTS

| 8,570,805 B2 | 10/2013 | Lee et al. |
| 10,424,348 B2 | 9/2019 | Suzuki et al. |
| (Continued) | | |

FOREIGN PATENT DOCUMENTS

JP 2015176626 A 10/2015

*Primary Examiner* — Jay W. Radke
(74) *Attorney, Agent, or Firm* — Kim & Stewart LLP

(57) ABSTRACT

According to one embodiment, a method of controlling a memory device includes supplying a second potential having a first value to a second electrode and simultaneously, or thereafter, supplying a third potential to a third electrode, and thereafter stopping supply of the third potential such that the potential of the third electrode decays while reducing the potential of the second electrode, and thereafter supplying a first potential to the first electrode.

8 Claims, 9 Drawing Sheets

Related U.S. Application Data continuation of application No. 15/910,410, filed on Mar. 2, 2018, now Pat. No. 10,424,348.

(51) Int. Cl.
  G11C 16/30 (2006.01)
  G11C 16/34 (2006.01)
  H01L 27/115 (2017.01)
  G11C 8/08 (2006.01)
  G11C 16/04 (2006.01)
  G11C 16/32 (2006.01)
  H01L 27/11582 (2017.01)

(56) References Cited

U.S. PATENT DOCUMENTS

| | | |
|---|---|---|
| 2007/0253253 A1 | 11/2007 | Aritome |
| 2013/0015519 A1 | 1/2013 | Fujii et al. |
| 2013/0070530 A1 | 3/2013 | Chen et al. |
| 2014/0029345 A1 | 1/2014 | Goda et al. |
| 2014/0293702 A1 | 10/2014 | Dong et al. |
| 2015/0221385 A1 | 8/2015 | Ahn et al. |
| 2015/0262681 A1 | 9/2015 | Hosono |
| 2016/0099066 A1 | 4/2016 | Dunga et al. |
| 2016/0118131 A1 | 4/2016 | Dong et al. |
| 2016/0372201 A1 | 12/2016 | Moschiano et al. |
| 2019/0355396 A1 | 11/2019 | Suzuki et al. |

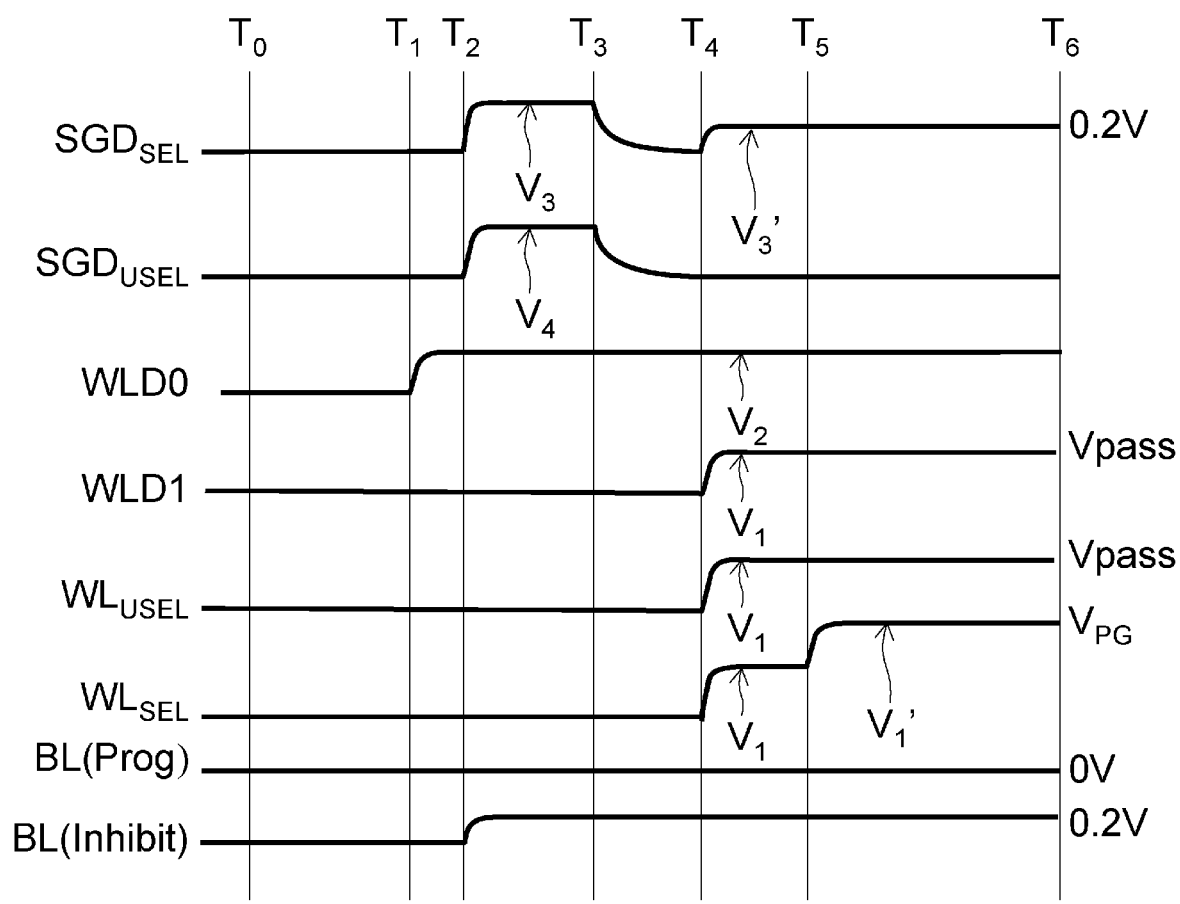

CONTROL METHOD FOR MEMORY DEVICE

CROSS-REFERENCE TO RELATED APPLICATIONS

This application is a continuation of U.S. patent application Ser. No. 16/526,589, filed on Jul. 30, 2019, which is a continuation of U.S. patent application Ser. No. 15/910,410, filed on Mar. 2, 2018, now U.S. Pat. No. 10,424,348, granted on Sep. 24, 2019, which is based upon and claims the benefit of priority from Japanese Patent Application No. 2017-173233, filed Sep. 8, 2017, the entire contents of each of which are incorporated herein by reference.

FIELD

Embodiments described herein relate generally to a control method for a memory device.

BACKGROUND

The development of a memory device that includes memory cells disposed three-dimensionally is ongoing. For example, a NAND memory device has a memory cell array with a three-dimensional structure including a plurality of stacked electrode layers and channel layers penetrating the electrode layers in a stacking direction. Different potentials are applied to the plurality of electrode layers, respectively, and the memory cell array is driven by potential differences between the electrode layers and the channel layers. To increase a degree of integration of the memory cell array having such a configuration, it is typically effective to make the electrode layers thinner so as to increase the number of stacked electrode layers and to make the interlayer insulating layers electrically isolating the electrode layers from one another thinner. However, making the electrode layers thinner increases the electrical resistance of the electrode layers, which is disadvantageous, and making the interlayer insulating films thinner disadvantageously increases the parasitic capacitances between the electrode layers. This will cause a delay in operating speed within the memory cell array and possible cause memory cells to malfunction.

DESCRIPTION OF THE DRAWINGS

FIG. 3 is a timing chart showing an operation performed by the memory device according to an embodiment.

DETAILED DESCRIPTION

Figure 1:
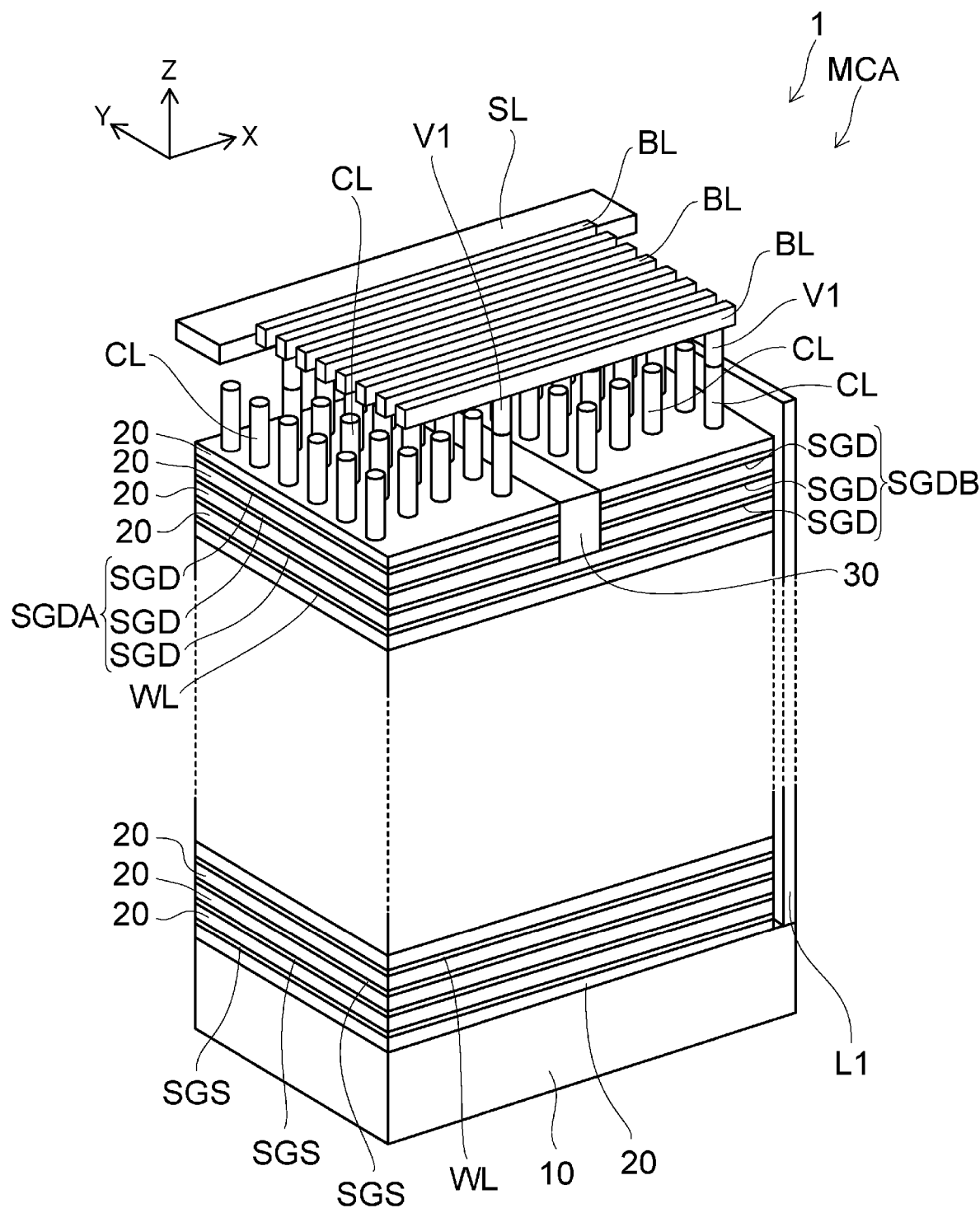
FIG. 1 is a perspective view showing a memory device according to an embodiment.

In general, according to one embodiment, a method of controlling a memory device includes supplying a second potential having a first value to a second electrode and simultaneously, or thereafter, supplying a third potential to a third electrode, and thereafter stopping supply of the third potential such that the potential of the third electrode decays while reducing the potential of the second electrode, and thereafter supplying a first potential to a first electrode.

Embodiments will be described hereinafter with reference to the drawings. In the drawings, the same aspects are denoted by the same reference signs and the detailed description of the repeated aspects may be omitted as appropriate, and different aspects will be described. It is noted that the drawings are either schematic or conceptual and the relationship between a thickness and a width of each section, a proportion of magnitudes of sections, and the like are not necessarily identical to actual devices. Furthermore, the same aspects may be illustrated with different sizes or different proportions depending on the drawing.

Moreover, a disposition and a configuration of each section will be described using an X-axis, a Y-axis, and a Z-axis shown in the drawings. The X-axis, the Y-axis, and the Z-axis are orthogonal to one another and represent an X direction, a Y direction, and a Z direction, respectively. The description will be often given while assuming that the positive Z direction is an upward direction and an opposite direction thereto is a lower direction.

FIG. 1 is a perspective view showing a memory cell array MCA of a memory device 1 according to an embodiment. The memory device 1 is, for example, a NAND nonvolatile memory device and includes memory cells disposed three-dimensionally therein.

As shown in FIG. 1, the memory device 1 includes a conductive layer (hereinafter, "source layer 10"), selection gates SGS, word lines WL, and selection gates SGD. The selection gates SGS are stacked on the source layer 10 with interlayer insulating films 20 therebetween. The word lines WL are stacked on the selection gates SGS with interlayer insulating films 20 therebetween. The selection gates SGD are stacked on the word lines WL with interlayer insulating films 20 therebetween. The selection gates SGS, the word lines WL, and the selection gates SGD have a two dimensional layout in the X and Y directions.

The selection gates SGD are divided into two groups spaced from each other in the X direction by, for example, an insulating layer 30. The insulating layer 30 is provided above the word lines WL and extends in the Y direction. Owing to this, selection gates SGDA and SGDB are disposed side by side over the word lines WL. The selection gates SGDA and SGDB include, for example, a plurality of selection gates SGD.

The source layer 10 is, for example, a P-well provided on a silicon substrate (not shown). Alternatively, the source layer 10 may be a polysilicon layer or a metal layer provided on a silicon substrate (not shown) with an interlayer insulating film (not shown) therebetween. The selection gates SGS, the word lines WL, and the selection gates SGD are metal layers containing, for example, tungsten (W). The interlayer insulating films 20 and the insulating layer 30 are electric insulators containing, for example, silicon oxide.

The memory device 1 also includes a plurality of columnar bodies CL. The columnar bodies CL penetrate through the selection gates SGS, the word lines WL, and the selection gates SGD, and extend in the Z direction that is a stacking direction of the columnar bodies CL. The memory device 1 further includes a plurality of bit lines BL and a source line SL provided above the selection gates SGD.

The columnar bodies CL are each electrically connected to one bit line BL through a contact plug V1. For example, one of the columnar bodies CL that share the selection gate SGDA and one of the columnar bodies CL that share the selection gate SGDB are electrically connected to one bit line BL. The source line SL is electrically connected to the source layer 10 by a source contact LI. The source contact L1 is a flat conductive body that extends in the Y direction and the Z direction alongside surfaces of the stacked selection gates SGS, word lines WL and selection gates SGD.

Figure 2A:
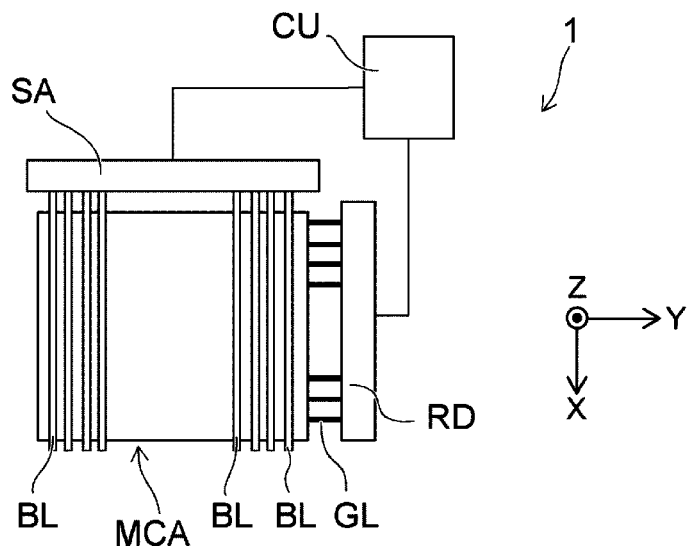
FIGS. 2A and 2B are schematic diagrams showing the memory device according to an embodiment.
Figure 2B:
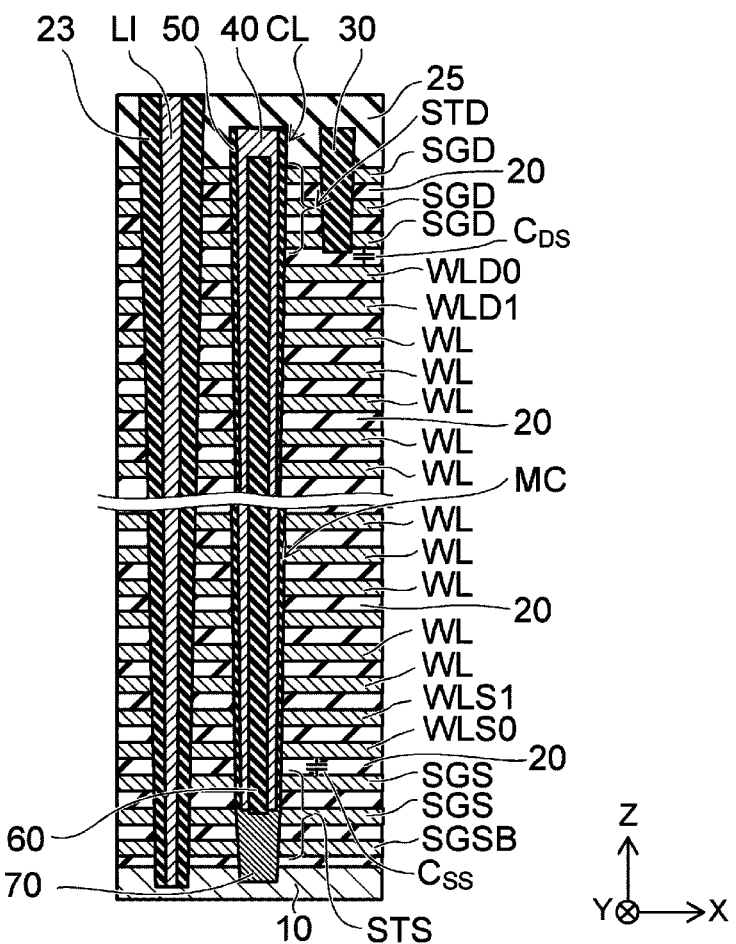

For ease of illustrating a structure of the memory device 1, FIG. 1 does not show an insulating layer 23 that is provided between the source contact L1 and the word lines WL and selection gates SGS, and SGD, and an interlayer insulating film 25 provided between the selection gate SGD and the bit lines BL (see FIG. 2B).

FIGS. 2A and 2B are schematic diagrams showing the memory device 1 according to the embodiment. FIG. 2A is a block diagram showing a configuration of the memory device 1. FIG. 2B is a schematic sectional diagram showing part of the memory device 1 sectioned along an X-Z plane.

As shown in FIG. 2A, the memory device 1 includes the memory cell array MCA, a sense amplifier SA, a row decoder RD, and a control unit CU. The sense amplifier SA is electrically connected to the memory cell array MCA through the bit lines BL. The row decoder RD is electrically connected to the memory cell array through the gate interconnections GL. The control unit CU controls operation of the memory cell array MCA through the sense amplifier SA and the row decoder RD.

The sense amplifier SA, the row decoder RD, and the control unit CU are provided in a circuit disposed, for example, around the periphery of the memory cell array MCA. Furthermore, the sense amplifier SA, the row decoder RD, and the control unit CU are not necessarily disposed in the circuit as regions separated from one another, but the circuit may include functions of the sense amplifier SA, the row decoder RD, and the control unit CU as a whole.

As shown in FIG. 2B, a plurality of electrode layers are stacked on the source layer 10 with the interlayer insulating films 20 located between adjacent electrode layers in the Z direction. The plurality of electrode layers is electrically connected to the row decoder RD through the gate interconnections GL (FIG. 2A). The plurality of electrode layers function as the selection gates SGS, the word lines WL, and the selection gates SGD, having potentials supplied thereto from, for example, the row decoder RD. In this example, the electrode layers include, in order from the source layer 10, selection gates SGSB and SGS, word lines WLS0, WLS1, WL, WLD1, and WLD0, and the selection gates SGD. The word lines WLS0, WLS1, WLD1, and WLD0 are so-called dummy word lines.

The columnar bodies CL penetrate the electrode layers in the Z direction and each includes, for example, a semiconductor layer 40, an insulating layer 50, and an insulating core 60. The insulating core 60 extends in the Z direction within each columnar body CL. The semiconductor layer 40 surrounds the side surfaces of the insulating core 60 and extends in the Z direction along the insulating core 60. The insulating layer 50 extends in the Z direction between the electrode layers and the semiconductor layer 40. The insulating layer 50 surrounds the side surfaces of the semiconductor layer 40.

The memory device 1 includes semiconductor channels 70 provided between, for example, the source layer 10 and the columnar bodies CL. The semiconductor channels 70 each penetrate the selection gate SGSB in the Z direction and electrically connects the source layer 10 to the semiconductor layer 40. Furthermore, the source contact L1 penetrates and divides the electrode layers in the X direction and is connected to the source layer 10. An insulating layer 23 is provided between the source contact L1 and the electrode layers to electrically isolate the source contact L1 from the electrode layers.

In the memory device 1, the memory cells MC are formed where a semiconductor layer 40 penetrates a word line WL. In each insulating layer 50, that portion located between the semiconductor layer 40 and a word line WL functions as a charge retention layer of a corresponding memory cell MC. The semiconductor layer 40 functions as a channel shared among a plurality of memory cells MC, while each word line WL functions as a control gate of a memory cell MC along the semiconductor layer 40.

The insulating layer 50 has, for example, an ONO structure in which a first silicon oxide film, a silicon nitride film, and a second silicon oxide film are stacked in sequence from the word lines WL to the semiconductor layer 40, and the insulating layer retains electric charges injected from the semiconductor layer 40 by a potential difference between the word line WL and the semiconductor layer 40, and it also releases the electric charges to the semiconductor layer 40.

Further, selection transistors STS are provided in portions where the semiconductor layer 40 and the semiconductor channel 70 penetrate a plurality of selection gates SGS. In addition, selection transistors STD are provided in portions where the semiconductor layer 40 penetrates a plurality of selection gates SGD. The semiconductor layer 40 also functions as the channel of the selection transistors STD and STS, and the selection gates SGS and SGD function as gate electrodes of the selection transistors STD and STS, respectively. The part of the insulating film 50 located between the semiconductor layer 40 and the selection gates SGS and between the semiconductor layer 40 and the selection gates SGD functions as a gate insulating film. Moreover, a gate insulating film, which is not specifically depicted, is provided between the selection gate SGSB and the semiconductor channel 70.

FIG. 3 is a timing chart showing an operation performed by the memory device 1 according to an embodiment. For example, predetermined potentials are supplied from the row decoder RD to the word lines WL, WLD0, and WLD1 and the selection gates SGDA and SGDB. The operation performed by the memory device 1 will now be described while assuming that a first potential $V_1$ is supplied to the word line WL and the word line WLD1, a second potential $V_2$ is supplied to the word line WLD0, a third potential $V_3$ is supplied to the selection gate SGDA, and a fourth potential $V_4$ is supplied to the selection gate SGDB.

In an example shown in FIG. 3, data is written to the memory cells MC during a period from time $T_0$ to $T_6$. Procedures for writing data to the memory cells MC will now be described with reference to FIG. 3.

It is assumed that the memory cells MC to which data is written are disposed in, for example, the semiconductor layers penetrating the selection gate SGDA. In the following description, it is assumed, for example, that the selection gate SGDA is $SGD_{SEL}$ and the other drain-side selection gate, for example, the selection gate SGDB, is $SGD_{USEL}$. It is also assumed that the selection transistor including the selection gate $SGD_{SEL}$ is $STD_{SEL}$, and the selection transistor including the selection gate $SGD_{USEL}$ is $STD_{USEL}$. Furthermore, it is assumed that the word line WL connected to the memory cells MC selected to write data thereto is $WL_{SEL}$ and other word lines WL are $WL_{USEL}$.

First, at time $T_1$, the second potential $V_2$ is supplied to the word line WLD0. The second potential $V_2$ is continuously applied to the word line WLD0 until time $T_6$.

Next, at time $T_2$, the third potential $V_3$ is supplied to the selection gate $SGD_{SEL}$ and the fourth potential $V_4$ is supplied to the selection gate $SGD_{USEL}$. As a result, both the selection transistors $STD_{SEL}$ and $STD_{USEL}$ are turned on. Here, a potential of the bit lines (Prog) connected to the channel layers (semiconductor layers 40) of the memory cells MC selected to write data thereto is zero V, and a potential of 0.2 V is supplied to the bit lines (Inhibit) connected to the channel layers (semiconductor layers 40) shared only among the unselected memory cells MC.

Next, at time $T_3$, supply of the third potential $V_3$ and the fourth potential $V_4$ to the selection gates $SGD_{SEL}$ and $SGD_{USEL}$ is stopped. The third potential $V_3$ and the fourth potential $V_4$ thereby fall off, and the voltage value decays from the applied potential to a lower potential to turn off the selection transistors $STD_{SEL}$ and $STD_{USEL}$. Voltage decay results in a gradual reduction of the voltage value over a period of time, and may occur as a result of stopping the application of a voltage to a conductor, such as a selection gate or word line. In this way, in a period from the time $T_2$ to $T_3$, the selection gates $SGD_{SEL}$ and $SGD_{USEL}$ are turned on, so that carriers are discharged from the semiconductor layers 40. This can facilitate boosting potentials of the semiconductor layers 40 in a state in which the selection transistors $STD_{USEL}$ and STS are turned off.

Subsequently, at time $T_4$, the first potential $V_1$ is supplied to the word lines WL penetrated by the semiconductor layers 40 including the selected memory cells MC and to the word line WLD1. At this time, the first potential $V_1$ is, for example, a potential $V_{pass}$ for turning on memory cell transistors. At the same time, a potential $V_3'$ is supplied to the selection gate $SGD_{SEL}$ to turn on the selection transistor $STD_{SEL}$. The potential $V_3'$ is lower than the potential $V_3$ and is, for example, 0.2 V.

Next, at time $T_5$, the potential of the word line $WL_{SEL}$ connected to the selected memory cells MC is increased to the potential $V_1'$. The potential $V_1'$ is, for example, a program voltage $V_{PG}$. For example, data can be written to the selected memory cells MC by injecting carriers to the charge retention layers of the selected memory cells MC. The potential $V_1'$ is applied until, for example, time $T_6$.

From the time $T_1$ to $T_6$, a potential of, for example, 0.2 V is supplied to the selection gates SGS. Owing to this, the selection transistors STS are turned off. From the time $T_4$ to $T_6$, the selection transistor $STD_{USEL}$ is turned off. Therefore, the potential of the semiconductor layers 40 penetrating the selection gate $SGD_{USEL}$ becomes a floating potential. Furthermore, the potential of the semiconductor layers 40 connected to the bit lines BL (Inhibit) is 0.2 V even where the semiconductor layers 40 penetrate the selection gate $SGD_{SEL}$. Owing to this, a potential difference between the potential $V_3'$ of the selection gate $SGD_{SEL}$ and the potential of the semiconductor layers 40 is narrowed and the selection transistor $STD_{SEL}$ connected to the bit lines BL (Inhibit) is turned off. As a result, the potential of the semiconductor layers 40 connected to the bit lines BL (Inhibit) become the floating potential. Owing to this, the potential of the semiconductor layers 40 other than those that function as the channel layers of the selected memory cells MC becomes the floating potential, and the potential is boosted to follow, for example, the potential supplied to the word lines WL. Therefore, even if the program voltage $V_{PG}$ is supplied to the word lines WL, then the potential difference between the word lines WL and the semiconductor layers 40 is narrowed, and data is not written to unselected memory cells MC.

Figure 4:
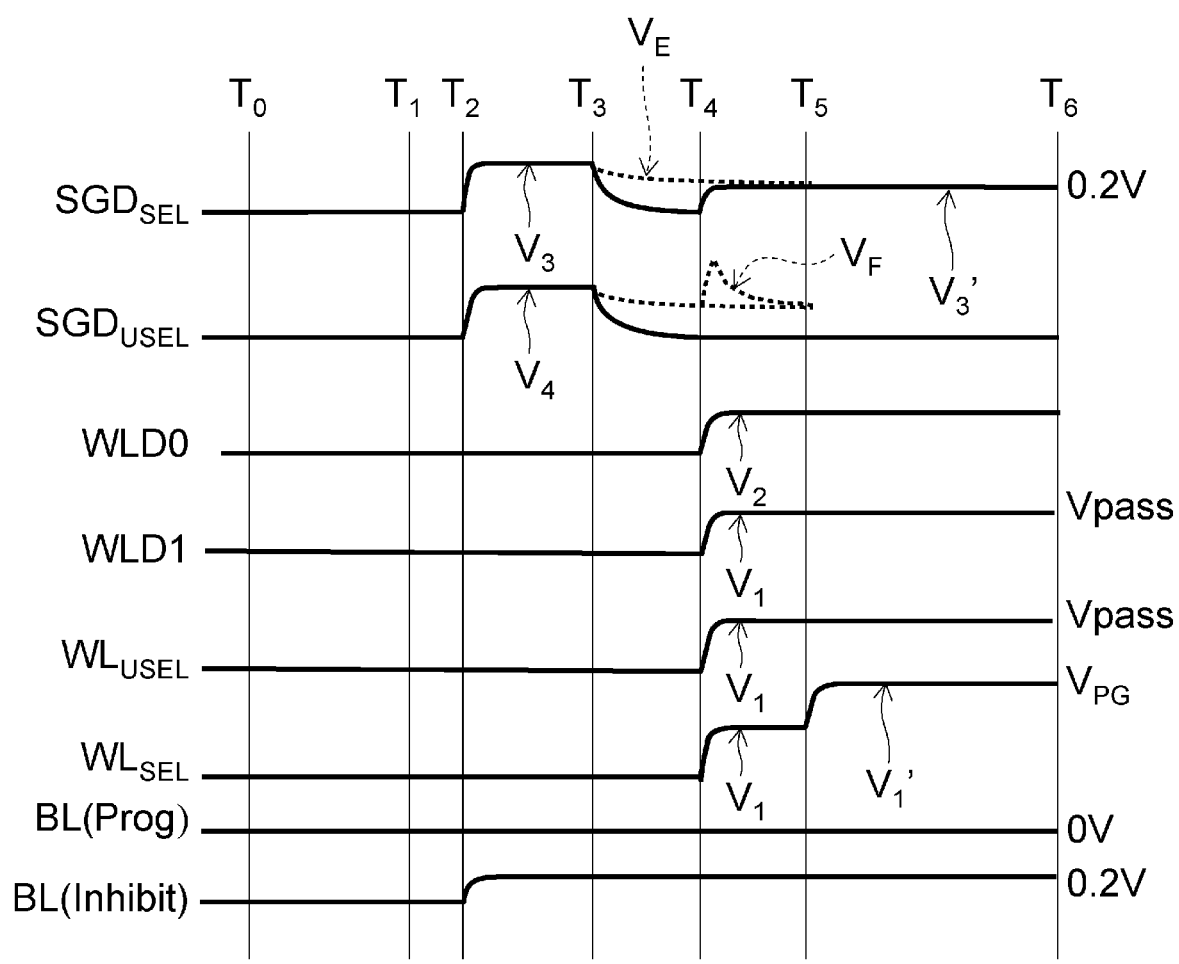
FIG. 4 is a timing chart showing an operation performed by a memory device according to a first comparative example.

FIG. 4 is a timing chart showing an operation performed by a memory device according to a first comparative example. In this example, at the time $T_4$ the second potential $V_2$ is supplied to the word line WLD0. That is, the second voltage $V_2$ is supplied to the word line WLD0 synchronously with the first potential $V_1$ supplied to the other word lines WL. The word line WLD0 is the word line WL closest to the selection gate SGD, and a parasitic capacitance CDs (see FIG. 2B) is present between the word line WLD0 and the selection gate SGD. Owing to this, an induced potential $V_F$ accompanying a potential change of the word line WLD0 is induced in the selection gate SGD.

For example, the third potential $V_3$ and the fourth potential $V_4$ supplied from the row decoder RD to the selection gates SGD are supplied from lead portions on ends of the selection gates SGD. Therefore, responses of the selection transistors STD located a distance from the end portions are delayed by the parasitic resistance of the selection gate SGD and delay waveforms as indicated by, for example, a potential $V_E$ shown in FIG. 4 are generated. In such a case, the potential of the selection gate $SGD_{USEL}$ at the time $T_4$ does not fall sufficiently. When the induced potential $V_F$ is further superimposed on the potential, the selection transistor $STD_{USEL}$ which is supposed to be turned off is turned on. Owing to this, the potential of the semiconductor layer 40 that functions as the channel layer of the selection transistor $STD_{USEL}$ does not become the floating potential, which often causes data to be written to the unselected memory cells MC. Furthermore, the selection transistors $STD_{SEL}$ penetrated by the channel layers (semiconductor layers 40) connected to the bit lines (Inhibit) are turned on, which often causes data to be written to the unselected memory cells MC.

According to the present embodiment, by contrast, the second potential $V_2$ is supplied to the word line WLD0 at the time $T_1$ and is kept until the time $T_6$ as is illustrated in FIG. 3. A potential fluctuation of the word lines WL is thereby shielded and the induced potential VF is not induced to the selection gate SGD. It is, therefore, possible to prevent the selection transistors STD from malfunctioning and prevent data from being erroneously written to the memory cells MC.

It is noted that the timing chart shown in FIG. 3 is given as an example and the timing chart is not always limited to that shown in FIG. 3. For example, the second potential $V_2$ supplied to the word line WLD0 may be supplied simultaneously with the third potential $V_3$ and the fourth potential $V_4$ supplied to the selection gates SGD. Furthermore, the second potential $V_2$ is supplied to the word line WLD0 preferably before the time $T_3$ at which the third voltage $V_3$ and the fourth voltage $V_4$ are made to fall. Moreover, the second potential $V_2$ may be also supplied to the word line WLD1 to intensify shielding of the selection gates SGD against the potential fluctuation of the word lines WL.

Figure 5:
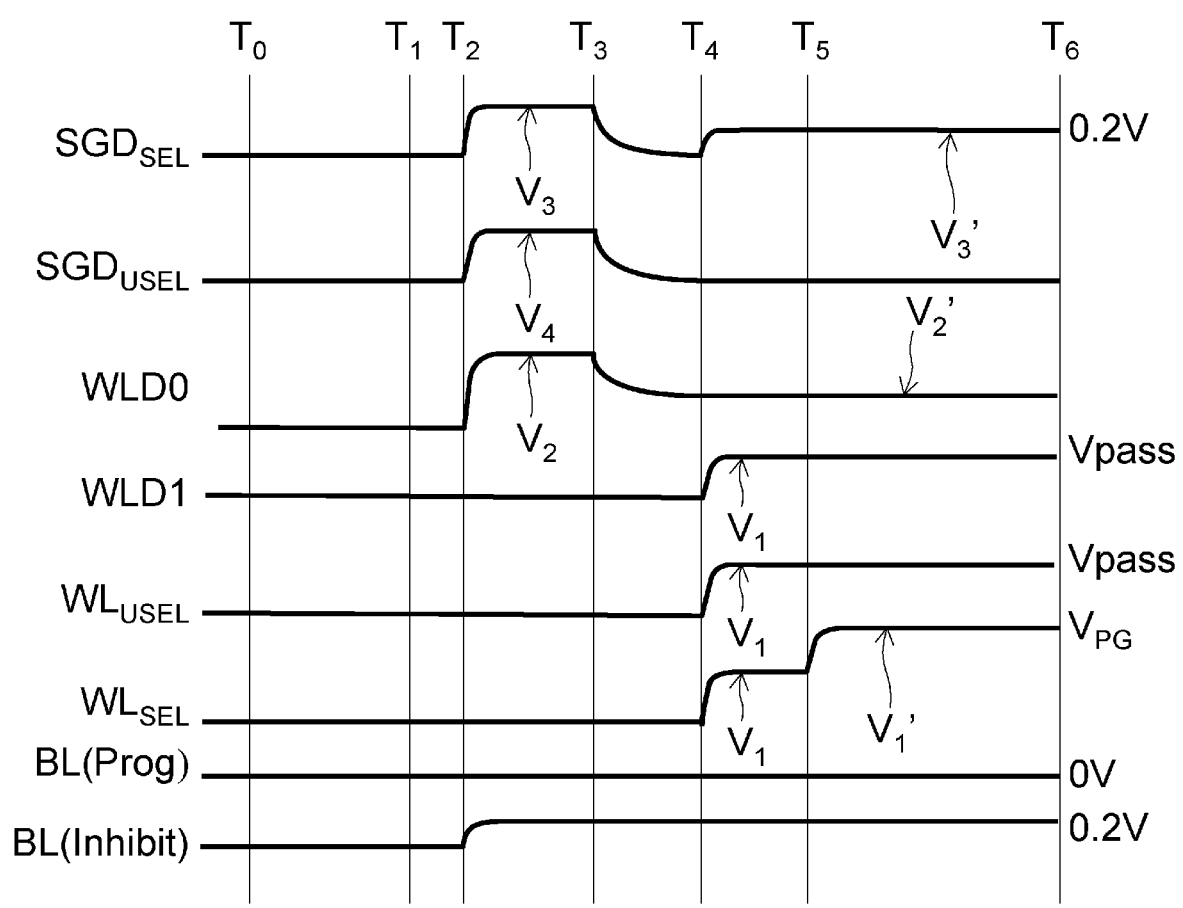
FIG. 5 is a timing chart showing an operation performed by a memory device according to a first modification of an embodiment.

FIG. 5 is a timing chart showing an operation performed by the memory device 1 according to a first modification of the embodiment. In this example, the second potential $V_2$ is supplied to the word line WLD0 synchronously with the supply of the third potential $V_3$ and the fourth potential $V_4$ to the selection gates SGD. That is, the second potential $V_2$ is supplied to the word line WLD0 at the time $T_2$, allowed to fall off at the time, and thereafter maintained at the potential $V_2'$ lower than the second potential $V_2$.

The third potential $V_3$ and the fourth potential $V_4$ are supplied to the selection gates SGD at the time $T_2$, and supply thereof is stopped at the time $T_3$. An inductive effect via the parasitic capacitance $C_{DS}$ between the word line WLD0 and the selection gate SGD causes, for example, the third potential $V_3$ and the fourth potential $V_4$ to change with a change in the second potential $V_2$. It is thereby possible to increase a response speed of the selection transistors STD. This can, in turn, reduce an influence of the parasitic resistances of the selection gates SGD on the selection transistors STD located spaced from the potential supply ends of the selection gates SGD.

Figure 6:
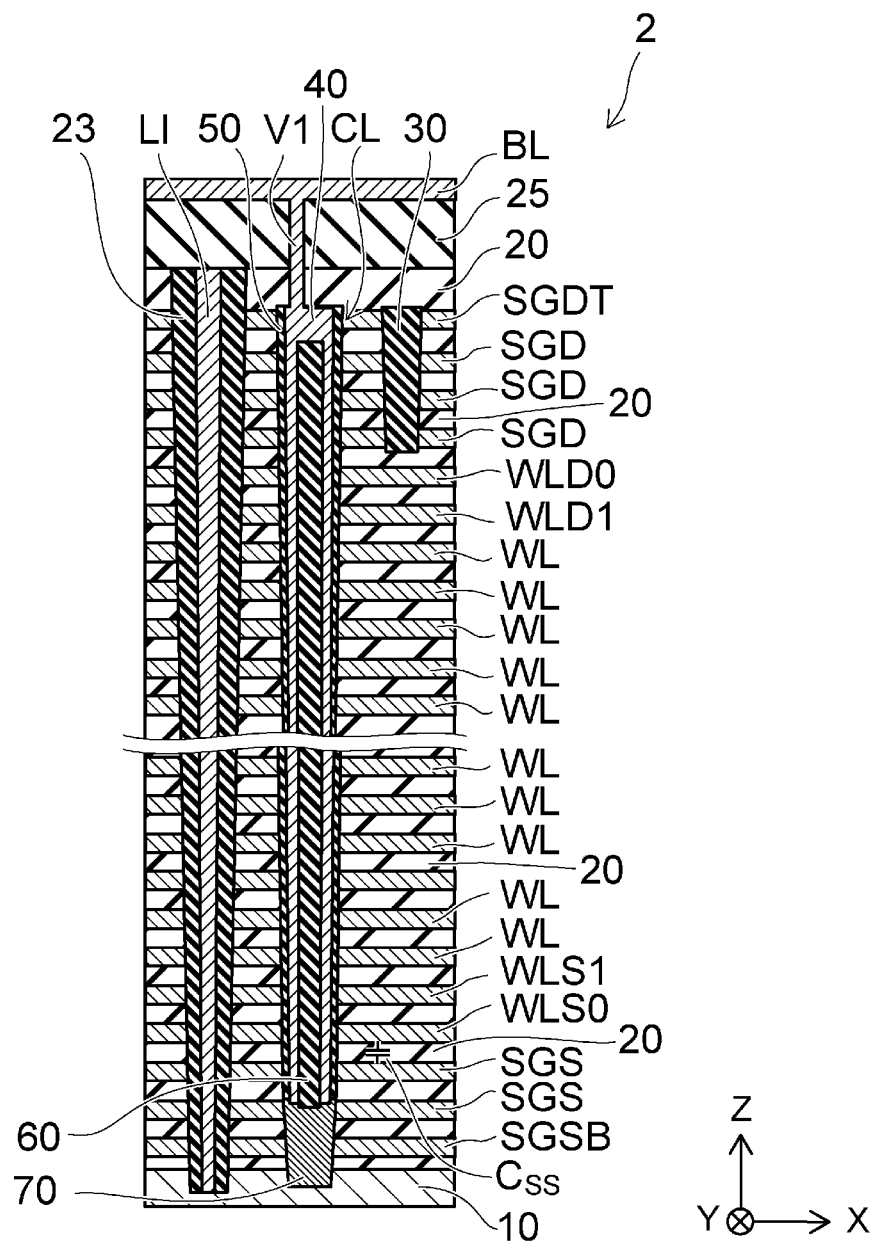
FIG. 6 is a schematic cross-sectional view showing an operation performed by a memory device according to a second modification of an embodiment.

FIG. 6 is a schematic cross-sectional view showing a second modification of the embodiment. In the memory device 2 shown in FIG. 6, a selection gate SGDT is provided on an uppermost layer of the selection gates SGD. For example, a common potential is supplied from the row decoder RD to a plurality of selection gates SGD stacked on the word lines WL. On the other hand, a fifth potential $V_5$ different from the potential supplied to the selection gates SGD is supplied to the selection gate SGDT.

Figure 7:
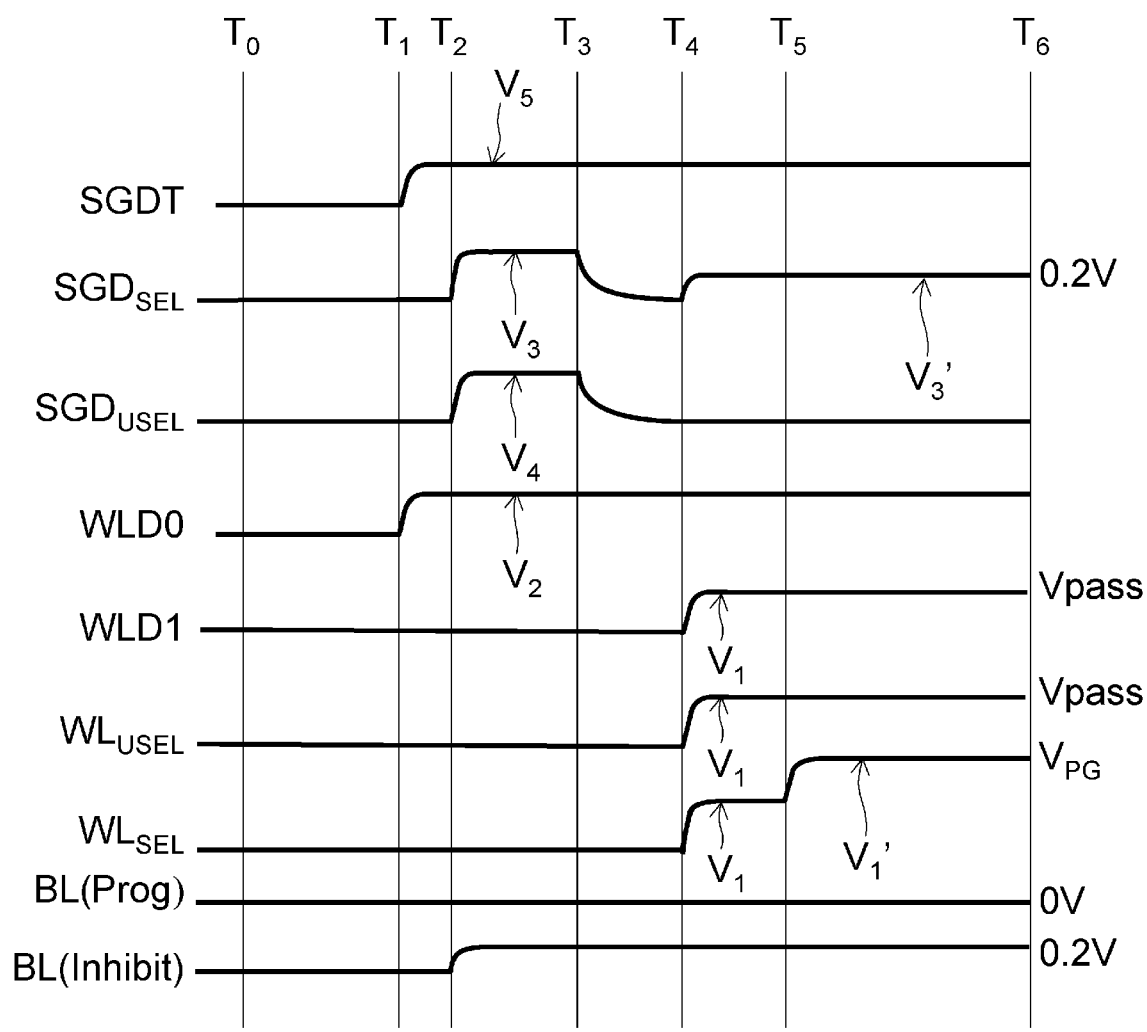
FIG. 7 is a timing chart showing an operation performed by the memory device according to a second modification of the embodiment.

FIG. 7 is a timing chart showing an operation performed by the memory device 2. The fifth potential $V_5$ is supplied to the selection gate SGDT at, for example, the time $T_1$ and maintained until the time $T_6$. That is, the fifth potential $V_5$ is supplied synchronously with, for example, the second potential $V_2$ supplied to the word line WLD0.

Figure 8A:
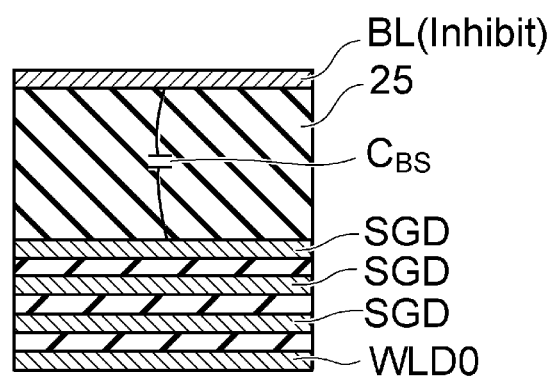
FIG. 8A is a cross-sectional view showing a configuration of a memory device according to a second comparative example.

FIG. 8A is a cross-sectional view showing a configuration of a memory device according to a second comparative example. As shown in FIG. 8A, in this example, the selection gate SGDT is not provided and a parasitic capacitance $C_{BS}$ is present between the uppermost layer of the selection gates SGD and the bit lines BL.

Figure 8B:
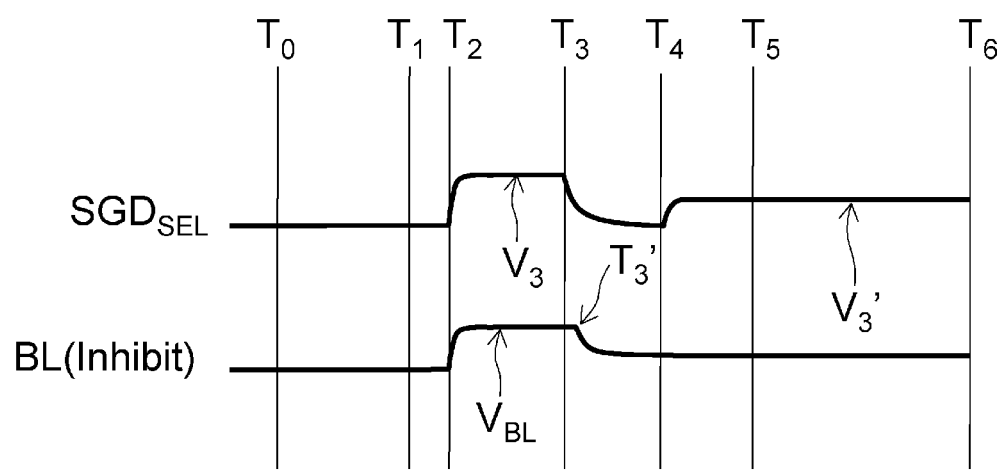
FIG. 8B is a timing chart showing an operation performed by this memory device.

FIG. 8B is a timing chart showing an operation performed by the memory device according to the second comparative example. It is assumed, for example, that the selection gate SGD is $SGD_{SEL}$ and the bit lines BL are the bit lines (Inhibit) connected to the channel layers (semiconductor layers 40) shared only among the unselected memory cells MC.

The third potential $V_3$ is supplied to the selection gate $SGD_{SEL}$ at the time $T_2$, and allowed to fall at the time $T_3$. Furthermore, the third potential $V_3'$ is supplied to the selection gate $SGD_{SEL}$ at the time $T_4$.

On the other hand, a potential $V_{BL}$ (for example, 0.2 V) is supplied to the bit lines BL (Inhibit). It is often preferable, for example, that supply of the potential $V_{BL}$ to the bit lines (Inhibit) is stopped to make the potential of the bit lines BL (Inhibit) become a floating potential. However, if the supply of the potential $V_{BL}$ is stopped at time $T_3'$ just after the third potential $V_3$ is allowed to fall, the potential of the bit lines BL (Inhibit) falls with a fall in the potential of the selection gate $SGD_{SEL}$ because of the parasitic capacitance CBs. Owing to this, the potential of the bit lines BL (Inhibit) falls from the potential $V_{BL}$, resulting in an increase in a potential difference between the semiconductor layers 40 connected to the bit lines BL (Inhibit) and the selection gate $SGD_{SEL}$. This often causes the selection transistors STD to be turned on and data to be erroneously written to the memory cells MC sharing the semiconductor layers 40 connected to the bit lines BL (Inhibit).

The memory device 2, by contrast, can shield the bit lines BL from the selection gate SGD and prevent data from being erroneously written to the memory cells MC by providing the selection gate SGDT. Timing of supplying the fifth potential $V_5$ to the selection gate SGDT is not limited to the example shown in FIG. 7. The fifth potential $V_5$ may be supplied at, for example, the time $T_2$ synchronously with the supply of the third potential $V_3$. Furthermore, the fifth potential $V_5$ is supplied to the selection gate SGDT preferably before the time $T_3$ at which the third potential $V_3$ is allowed to fall.

Figure 9:
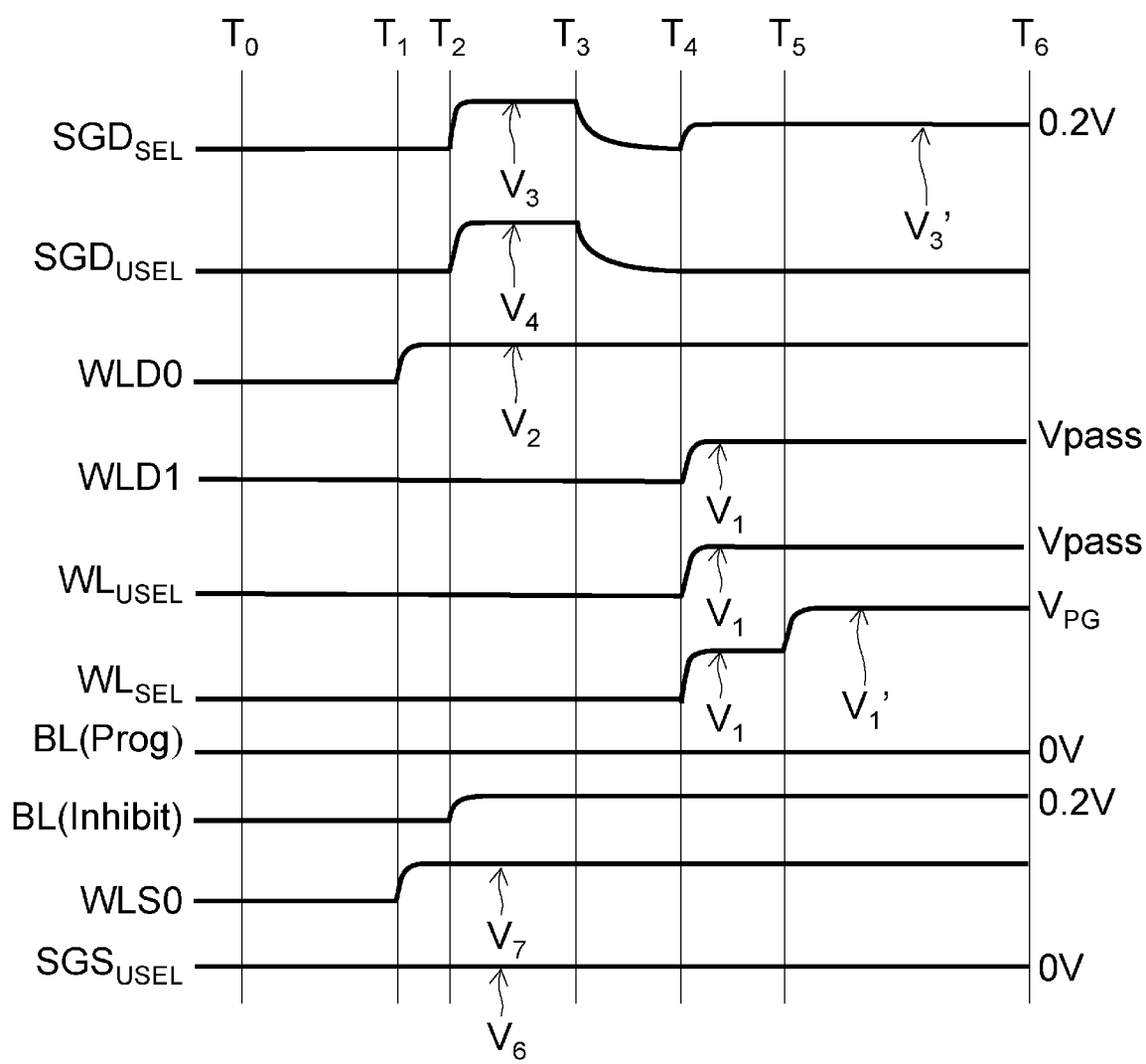
FIG. 9 is a timing chart showing an operation performed by a memory device according to a third modification of an embodiment.

FIG. 9 is a timing chart showing an operation performed by the memory device 1 according to a third modification of the embodiment. In this example, a seventh potential $V_7$ is supplied from the row decoder RD to the word line WLS0 (see FIG. 2B) located between the selection gate SGS and the word line WL. At this time, a sixth potential $V_6$ is supplied to the selection gates SGS. The sixth potential $V_6$ is, for example, zero V and the selection transistors STS are turned off. Moreover, a parasitic capacitance $C_{SS}$ (see FIG. 2B) is present between the word line WLS0 and the selection gate SGS.

As shown in FIG. 9, the seventh potential $V_7$ is supplied at the time $T_1$ and maintained on until the time $T_6$. It is thereby possible to shield the selection gates SGS against a potential change of the word lines WL and prevent the selection transistors STS from malfunctioning. That is, it is possible to prevent a potential fluctuation of the selection gates SGS induced by the potential change of the word lines WL and prevent the selection transistors STS from being turned on.

Timing of supplying the seventh potential $V_7$ to the word line WLS0 is not limited to the example shown in FIG. 9. The seventh potential $V_7$ may be supplied at, for example, the time $T_2$. The seventh potential $V_7$ is preferably supplied before the time $T_4$ at which the first potential $V_1$ is supplied to the word lines WL. Moreover, the seventh potential $V_7$ may also be supplied to the word line WLS1 located between the word lines WLS0 and WL to intensify shielding of the selection gates SGS.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A method of writing data into memory cells of a three-dimensional memory array including a first selection gate, a first word line located above the first selection gate, a plurality of second word lines stacked in a first direction above the first word line, a second selection gate located above the plurality of second word lines and extending in a second direction crossing the first direction, a first columnar body including a first semiconductor layer extending through the first selection gate, the first word line, the plurality of second word lines, and the second selection gate, a second columnar body including a second semiconductor layer extending through the first selection gate, the first word line, the plurality of second word lines and the second selection gate, a first of bit line located above the second selection gate, a second bit line located above the second selection gate, the first bit line electrically connected to the first columnar body, the second bit line electrically connected to the second columnar body, wherein a plurality of first memory cells are formed at intersections between the plurality of second word lines and the first semiconductor layer, and a plurality of second memory cells are formed at intersections between the plurality of second word lines and the second semiconductor layer, the method comprising:

applying a first potential at a first value to a first line among the plurality of second word lines while a second potential at a second value is being applied to the second selection gate, the first line connected to one of the plurality of first memory cells to be programmed;

applying a third potential at a third value that is less than the second value to the first bit line before applying the first potential at the first value to the first line;

applying a fourth potential at a fourth value that is greater than the third value to the second bit line before application of the first potential at the first value to the first line; and applying a fifth potential at a fifth value to the first word line before or simultaneously with application of the fourth potential at the fourth value to the second bit lines.

2. The method according to claim 1, further comprising:
applying the first potential at the first value to the first line at a first time, then applying the first potential at a sixth value to the first line at a second time after the first time, the sixth value being greater than the first value.

3. The method according to claim 1, wherein the first selection gate is maintained at a voltage of 0.

4. The method according to claim 1, wherein the fifth potential at the fifth value is applied to the first word line before the application of the fourth potential at the fourth value to the second bit lines.

5. The method according to claim 1, wherein the fifth potential at the fifth value is applied to the first word line simultaneously with the application of the fourth potential at the fourth value to the second bit lines.

6. The method according to claim 1, wherein the second value is less than the first value.

7. The method according to claim 6, wherein the third value is zero.

8. The method according to claim 1, wherein the second value and the fourth value are equal to each other.

* * * * *

UNITED STATES PATENT AND TRADEMARK OFFICE
CERTIFICATE OF CORRECTION

PATENT NO. : 11,264,061 B2
APPLICATION NO. : 17/197632
DATED : March 1, 2022
INVENTOR(S) : Ryota Suzuki and Tatsuo Izumi It is certified that error appears in the above-identified patent and that said Letters Patent is hereby corrected as shown below:

In the Claims

In Column 8, Claim 1, Line 66, please delete "of" after "first".

Signed and Sealed this
Twenty-second Day of November, 2022

Katherine Kelly Vidal
Director of the United States Patent and Trademark Office